(12) United States Patent
Yuuki et al.

(10) Patent No.: US 7,339,411 B2
(45) Date of Patent: Mar. 4, 2008

(54) SEMICONDUCTOR INTEGRATED CIRCUIT HAVING NOISE DETECT CIRCUITS DETECTING NOISE ON POWER SUPPLY NETS

(75) Inventors: Fumio Yuuki, Kamifukuoka (JP); Katsuya Tanaka, Kokubunji (JP); Takeshi Kato, Akishima (JP); Teruhisa Shimizu, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/253,833

(22) Filed: Oct. 20, 2005

(65) Prior Publication Data
US 2006/0033559 A1  Feb. 16, 2006

Related U.S. Application Data

(63) Continuation of application No. 09/946,451, filed on Sep. 6, 2001, now abandoned.

(30) Foreign Application Priority Data

Jan. 24, 2001  (JP) ............... 2001-015195

(51) Int. Cl.
  *H03K 17/24* (2006.01)
(52) U.S. Cl. ............ 327/198; 365/228; 714/47
(58) Field of Classification Search ............... None
  See application file for complete search history.

(56) References Cited

U.S. PATENT DOCUMENTS

| 6,118,315 | A | 9/2000 | Guedj | 327/143 |
| 6,191,647 | B1 | 2/2001 | Tanaka et al. | 327/551 |
| 6,509,768 | B2 | 1/2003 | Polizzi et al. | 327/143 |
| 6,675,301 | B1 * | 1/2004 | Kurosawa | 713/300 |
| 6,721,903 | B2 | 4/2004 | Yoshioka et al. | 714/10 |
| 2001/0018752 | A1 | 8/2001 | Yoshioka et al. | 714/47 |

FOREIGN PATENT DOCUMENTS

JP  9-73400  3/1997

* cited by examiner

*Primary Examiner*—Kenneth B. Wells
*Assistant Examiner*—Terry L. Englund
(74) *Attorney, Agent, or Firm*—Mattingly, Stanger, Malur & Brundidge, PC

(57) ABSTRACT

A processor or a semiconductor integrated circuit has circuit blocks performing signal processing, internal power supply nets, noise detecting circuits corresponding to each circuit block that detect noise on the power supply nets and an interruption handling circuit that prevents a malfunction in processing within a circuit block caused by noise on the power supply nets. When noise is detected, the interruption handling circuit performs an interruption by sending an interruption signal to the circuit block relating to the signal processing for preventing a malfunction to the circuit block. During the operation of a plurality of stages for executing an instruction, noise is monitored at every stage. If no noise is detected through a final stage, the result is outputted. If noise is detected at any one of the stages, then an interruption process is performed.

3 Claims, 14 Drawing Sheets

US 7,339,411 B2

SEMICONDUCTOR INTEGRATED CIRCUIT HAVING NOISE DETECT CIRCUITS DETECTING NOISE ON POWER SUPPLY NETS

This is a continuation application of U.S. Ser. No. 09/946,451, filed Sep. 6, 2001, now abandoned.

BACKGROUND OF THE INVENTION

The present invention relates to a semiconductor integrated circuit that prevents a malfunction caused by noise on power supply nets and is suitable to cost reduction, and in particular, to a CMOS processor.

Now, researches and developments of gigahertz CMOS processors are vigorously performed. In order to enable operation in gigahertz, noise-proof engineering becomes important with a high-speed circuit technology. It is because the noise on the power supply nets generates delay deterioration and a malfunction of a circuit and it becomes an obstruction of acceleration. The noise on power supply nets in an LSI chip is roughly divided into: (1) RF noise by circuit operation; and (2) direct current drop by a power supply resistance, and the item (1) is dominant in particular.

As a general measure of RF noise reduction, there is a method of mounting bypass capacitors or condensers in an LSI chip. This is a method of connecting bypass condensers to respective places of power supply nets so that a malfunction may not occur to the worst noise in the LSI chip.

FIG. 15 shows a conventional semiconductor integrated circuit on which bypass condensers are mounted. Power supply nets inside a chip are arranged in a mesh-like shape in the XY directions. The bypass condensers are arranged in an area just under the power supply nets inside the chip in the Y direction, and areas, which are vacant after spreading gates all over, as much as possible. A bypass condenser is typically formed with a capacity between gate channels of an MOS transistor. In a PMOS transistor, VSS is connected to a gate, and a drain and a source are connected to VDD. In an NMOS transistor, VDD is connected to a gate, and VSS is connected to a drain and a source. Moreover, a necessary amount of condensers is decided in consideration of the switching current of MOS transistors in an entire chip. In a certain processor chip that has the power dissipation of 100 W with the chip size of 17 mm square, bypass condensers occupy 20% of chip size.

In future LSI chips, further acceleration and high integration progress will be advanced, and hence the increase of the noise on power supply nets can be predicted. Thus, the impedance of power supply nets becomes high by the acceleration, and power dissipation increases by high integration, and hence the noise on the power supply nets increases.

On the other hand, as a preventive measure against a malfunction caused by the noise on power supply nets, a method of detecting the noise and performing interruption is known. As a conventional method of the noise detection and interruption processing, for example, a method described in JP-A-9-73400 is known. The external noise that invades into the power supply nets of an I/O circuit section arranged around a semiconductor integrated circuit is detected, and a malfunction of internal circuits is prevented by the interruption.

Furthermore, as a noise detecting circuit, for example, a circuit described in U.S. Pat. No. 6,191,647 is known. This circuit has the structure of receiving power supply from a power supply line other than a power supply line set as an object of noise observation to avoid that noise on the power supply nets influences the observation of noise itself.

SUMMARY OF THE INVENTION

As mentioned above, in conventional semiconductor integrated circuits, preventive measures against a malfunction caused by the increase of the noise amount in relation with the acceleration and high integration have the following problems:

An amount of noise on power supply nets generated in an LSI by the proceeding of the acceleration and high integration increases, and it is necessary to increase the quantity of on-chip bypass condensers in the LSI in order to reduce the amount of noise. However, as a result, chip size becomes large, manufacturing yields of chips are lowered, and hence, their cost is increased.

Moreover, considerations for prevention of malfunctions caused by the noise generated in the internal circuits of LSI chips are insufficient. A conventional semiconductor integrated circuit detects external noise which enters into power supply nets of an I/O circuit and prevents a malfunction, but does not correspond to the prevention of a malfunction caused by the noise inside internal circuits.

Moreover, in a conventional noise detecting circuit, considerations about the noise detection under a noise environment are insufficient. In general, a noise detecting circuit judges that the voltage difference between a supply voltage signal to be monitored and a power supply voltage of a circuit is noise. A power supply voltage for a noise detecting circuit that operates with a power supply where the noise on power supply nets is generated is drifted by the noise. Hence, if the noise signal and power supply are aligning even if it the noise is received, the noise detecting circuit cannot detect the voltage difference between the power supply voltage and the noise. For enabling noise detection in the environment that such noise is generated there is a method of constituting a noise detecting circuit with a power supply other than the power supply that generates the noise. Nevertheless, since the arrangement of another power supply net increases restrictions of wiring of other signal lines, wiring property is deteriorated.

A first object of the present invention is to provide a semiconductor integrated circuit which prevents a malfunction of a semiconductor integrated circuit and makes cost reduction possible, in order to solve the above-described problem (1). A second object of the present invention is to provide a semiconductor integrated circuit that can prevent a malfunction caused by noise in an internal circuit of the semiconductor integrated circuit, in order to solve an above-described problem (2). A third object of the present invention is to provide a noise detecting circuit that can detect noise also under a noise environment, in order to solve the above-described problem (3).

In order to attain the above-described first and second objects, in a semiconductor integrated circuit which consists of a plurality of circuit blocks performing signal processing, the configuration of the present invention is characterized by including a noise detecting circuit which detects noise on power supply nets inside at least one circuit block, and performing interruption for preventing a malfunction to the above-described circuit block itself or another circuit block relating to this signal processing with this detection signal of the above-described noise detecting circuit.

Moreover, in a processor which consists of a plurality of logical circuit blocks or memory circuit blocks, the processor has a noise detecting circuit which detects noise on power supply nets inside at least one circuit block, and a circuit block receiving a detection signal of the above-described noise detecting circuit and performing recovery processing to the above-described logical circuit blocks or memory circuit blocks.

Furthermore, in a semiconductor integrated circuit which consists of a plurality of circuit blocks which perform signal processing, the semiconductor integrated circuit has at least one pair of circuit blocks, which has the same functions and operates in parallel, and has a noise detecting circuit, which detects noise on power supply nets, inside at least one of the above-described pair of circuit blocks, and collates the signal processing result of the above-described plurality of circuit blocks with a detecting signal of the above-described noise detecting circuit and performs interruption for preventing a malfunction to the circuit block itself or other circuit blocks relating to this signal processing.

Then, in a processor which consists of a plurality of logical circuit blocks or memory circuit blocks, the processor has a circuit block that has at least one pair of circuit blocks that operates in parallel to each other and is redundantly doubled, and has a noise detecting circuit which detects noise on power supply nets inside at least one of the above-described pair of circuit blocks, collates the signal processing result of the above-described pair of circuit blocks with a detection signal of the above-described noise detecting circuit, and performs recovery processing.

Moreover, the above-described semiconductor integrated circuit makes a circuit block itself or other circuit blocks relating to this signal processing rerun the signal processing by the above-described interruption if a detection signal which shows that noise on power supply nets which induces a malfunction arises from the above-described power supply noise detecting circuit is outputted.

In addition, the above-described semiconductor integrated circuit moves to system failure treatment if a detection signal which shows that noise on power supply nets which induces a malfunction arises from the above-described power supply noise detecting circuit is again outputted at the time of the above-described rerun.

Moreover, the above-described semiconductor integrated circuit suspends an output of the signal processing result of the above-described circuit block in the clock cycle concerned by the above-described interruption and outputs the signal processing result after the following cycle if a detection signal which shows that noise on power supply nets which induces a malfunction arises from the above-described power supply noise detecting circuit is outputted.

In addition, the above-described semiconductor integrated circuit performs the above-described interruption if the signal processing results from the above-described pair of circuit blocks differ from each other, or if a detection signal which shows that noise on power supply nets which induces a malfunction arises from the above-described power supply noise detecting circuit is outputted.

In order to attain the above-described third object, in the above-described semiconductor integrated circuit, the present invention supplies electric power to the above-described power supply noise detecting circuit from power supply nets that are shared with the above-described circuit blocks, and generates a dedicated power supply, which is free from the influence of noise from the above-described power supply nets, inside a power supply noise detecting circuit.

In addition, in the above-described semiconductor integrated circuit, the above-described power supply noise detecting circuit includes a noise detector which detects the noise produced in power supply nets of the above-described circuit block, a detection signal holder which holds an output of the above-described noise detector in a predetermined period, and a power supply which generates a dedicated power supply, which is free from the influence of noise from the above-described power supply nets, and supplies electric power thereof to the above-described noise detector.

Moreover, in the above-described power supply noise detecting circuit, the above-described noise detector includes a level shift circuit that shifts a voltage in the above-described power supply nets to a predetermined reference voltage level by making the voltage in the above-described power supply nets as an input, and a level discriminator which judges whether an output of the above-described level shift circuit exceeds a predetermined threshold voltage level.

In addition, in the above-described power supply noise detecting circuit, the above-described detection signal holder includes a dynamic circuit of making a period, when the dynamic circuit operates in response to an output of the above-described noise detector, be an evaluation phase, and making periods except the above-described predetermined period be a precharge phase.

Furthermore, in the above-described power supply noise detecting circuit, the above-described power supply generates a voltage that fluctuates with following the voltage fluctuation of a positive power supply or a negative power supply on the above-described power supply nets.

Then, the above-described power supply noise detecting circuit generates a reset signal from a clock synchronization signal or its delayed signal, the above-described noise detector and the detection signal holder detect noise in a LOW period of the reset signal, and hold a detection signal, and the above-described power supply charges a dedicated power supply in a HIGH period of the above-described reset signal.

DESCRIPTION OF THE EMBODIMENTS

Embodiment 1

Figure 1:
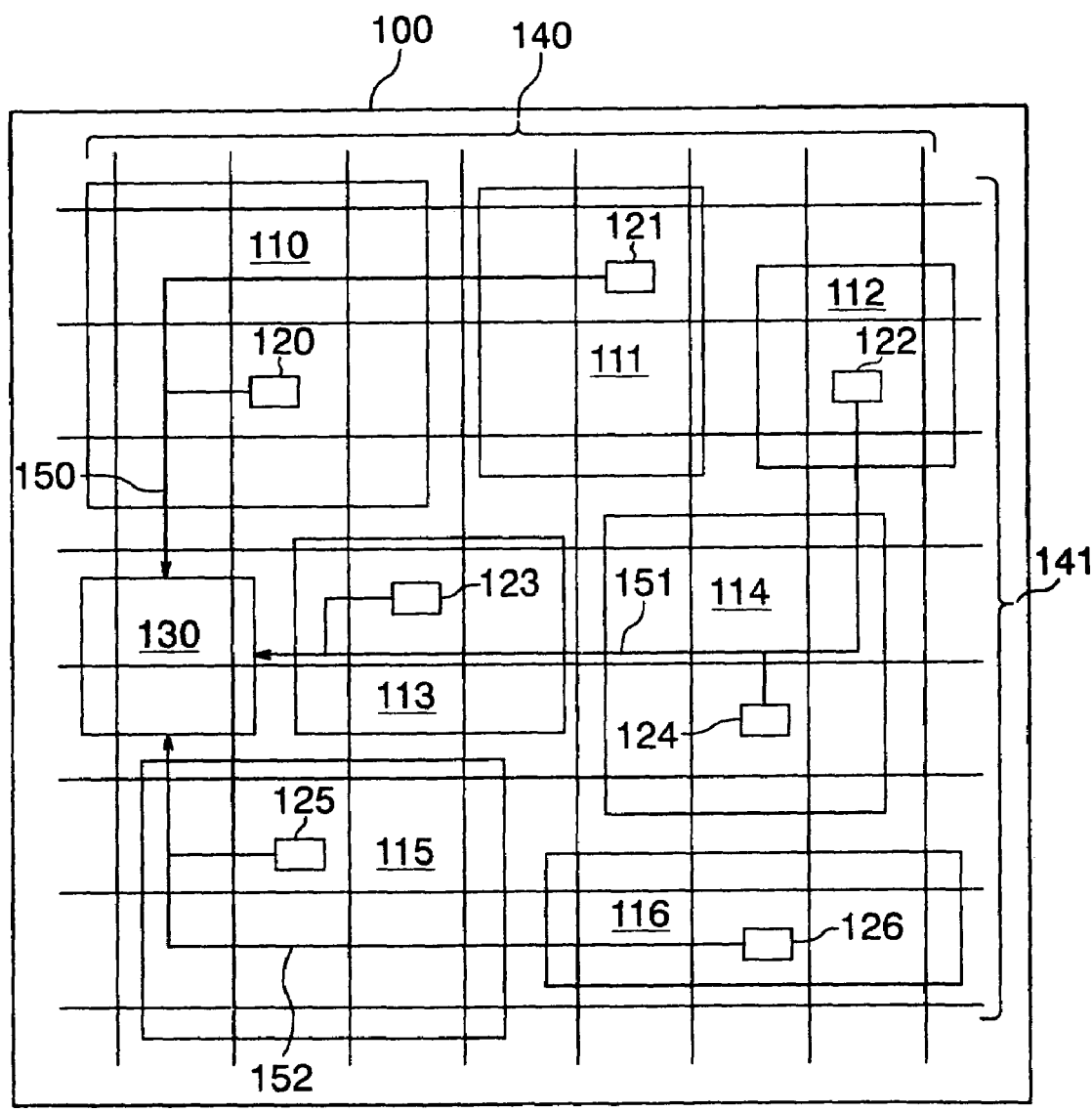
FIG. 1 is a schematic diagram of a semiconductor integrated circuit chip according to a first embodiment of the present invention.

FIG. 1 is a schematic diagram showing a semiconductor integrated circuit that has a noise detecting circuit according to a first embodiment of the present invention. In FIG. 1, a semiconductor integrated circuit 100 comprises a plurality of circuit blocks 110, 111, 112, 113, 114, 115, and 116, noise detecting circuits 120, 121, 122, 123, 124, 125, and 126 corresponding to each circuit block, an interruption handling circuit 130, and internal power supply nets 140, and 141.

Figure 2:
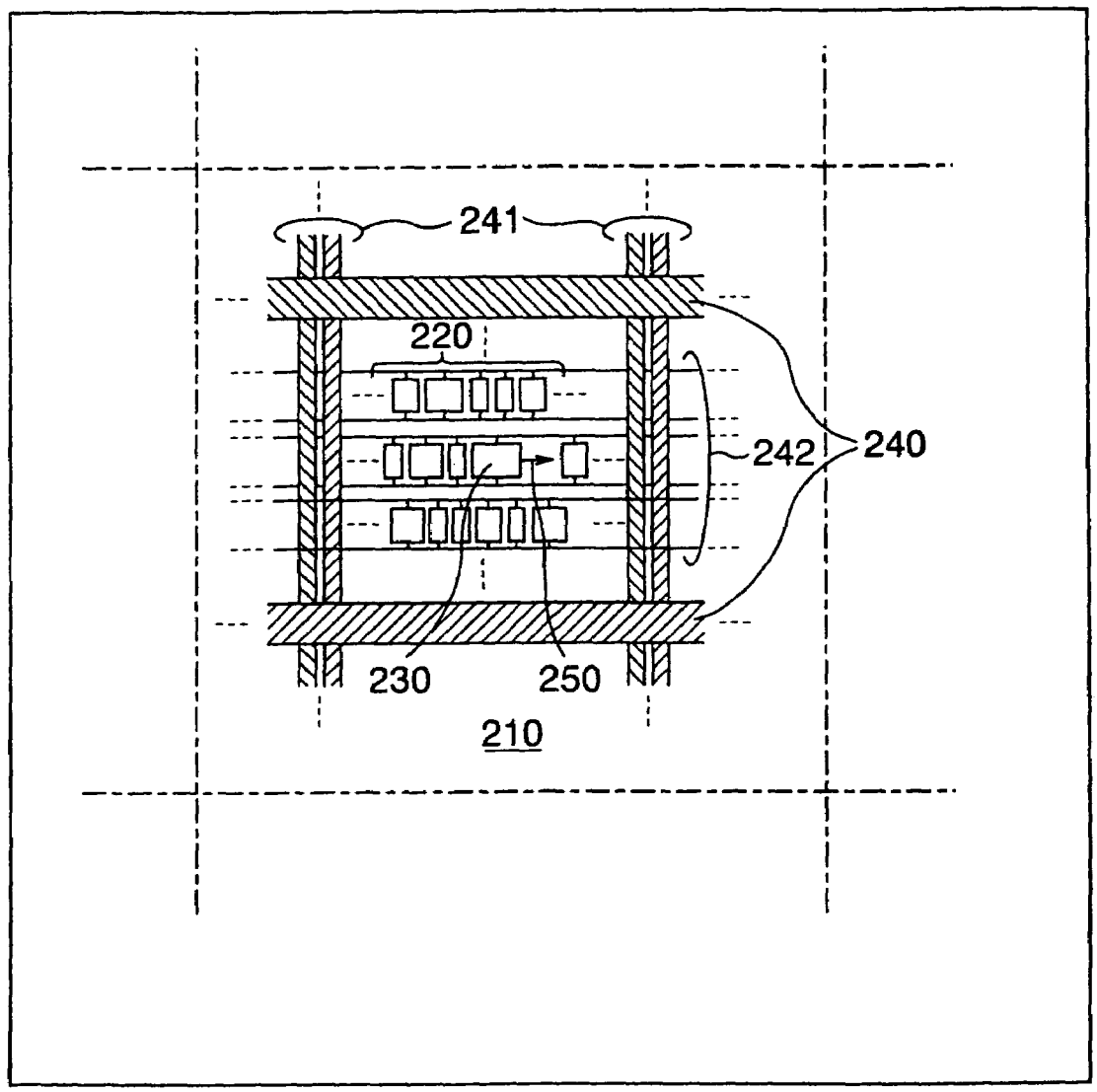
FIG. 2 is a schematic diagram showing a circuit block according to the first embodiment of the present invention in detail.

FIG. 2 is a schematic diagram showing a circuit block according to the first embodiment of the present invention in detail. In FIG. 2, a circuit block 210 consists of a general logic gate 220, a noise detecting circuit 230, and internal power supply nets 240, 241, and 242. The noise detecting circuit 230 is connected to the same power supply nets as those of the general logic gate 220.

In the circuits in FIG. 1 or FIG. 2, if detecting noise on the power supply nets having a level, which is an error-including level or more, in the circuit block 110, 111, 112, 113, 114, 115, 116, or 210, the noise detecting circuit 120, 121, 122, 123, 124, 125, 126, or 230 sends a detection signal 150, 151, 152, or 250 to the interruption handling circuit 130. Then, the interruption handling circuit 130 that receives the signal performs interruption by sending an interruption signal to the circuit block relating to this signal processing, which in not shown.

Figure 3:
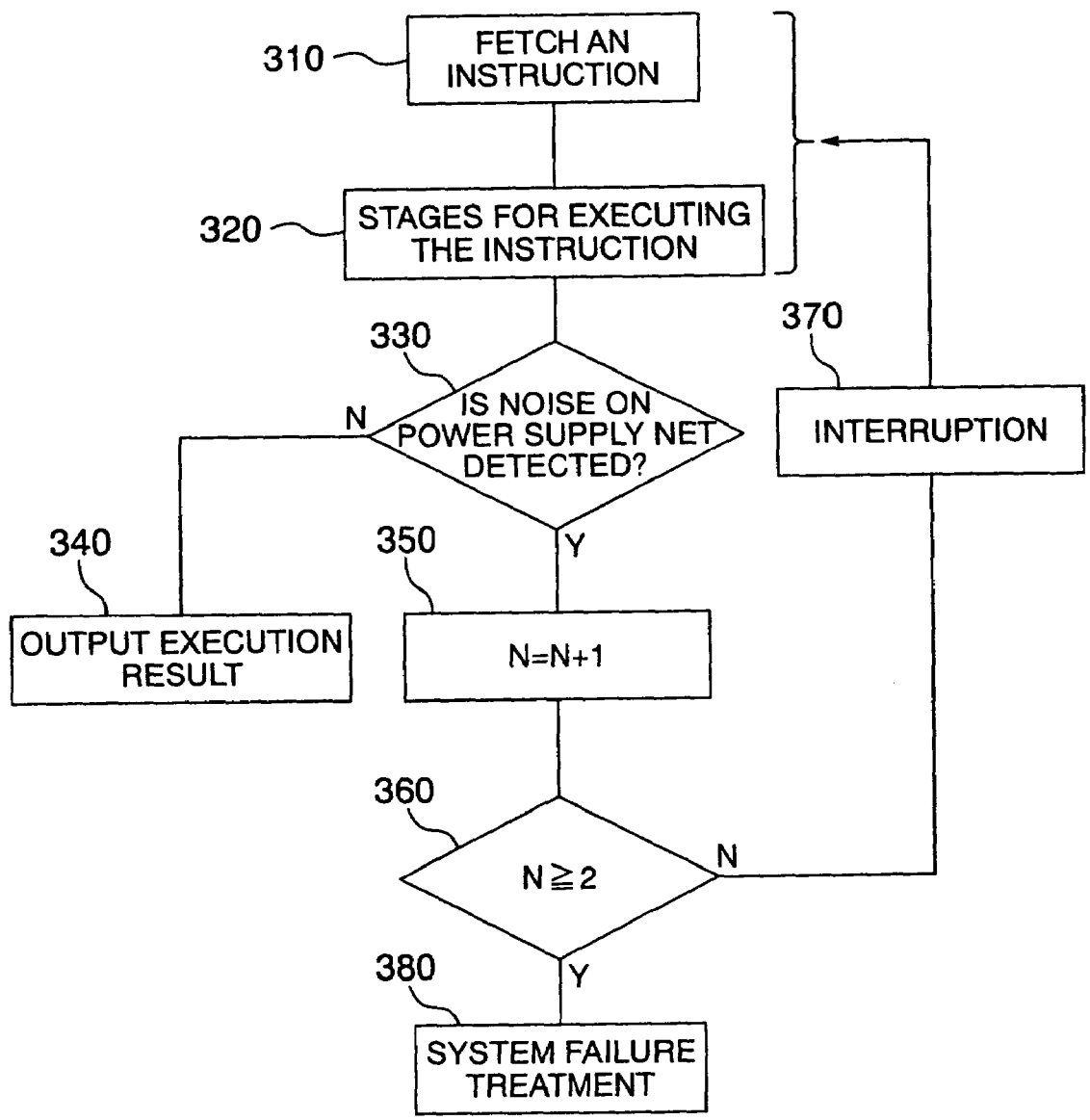
FIG. 3 is a flow chart showing an interruption of the first embodiment of the present invention.

FIG. 3 is a flow chart showing the interrupt processing of the first embodiment of the present invention.

A semiconductor integrated circuit of this embodiment executes an instruction after receiving the instruction, and outputs the result. The interruption processing by detection of noise on the power supply nets is performed according to a flow in FIG. 3. An instruction is fetched by the semiconductor integrated circuit (step 310). During the operation of a plurality of stages for executing the instruction (step 320), noise is monitored every stage (step 330). If there is no noise to a final stage, the result is outputted (340). If noise is detected on any one of stages, the process moves to interruption (370). Then, a rerun by the interruption is performed after returning to the stage where the interruption arises. In addition, if noise is detected again (330) even if it a rerun is performed, and if the interruption 370 (rerun) is performed again, it may be repeated forever. Therefore, if the noise is detected at a stage again (N is incremented in step 350 and then it is determined if $N \geq 2$ in step 360), the process shifts to a system failure treatment (380). As a concrete system failure treatment (380), for example, forced termination of a program being executed can be cited.

As described above, the first embodiment of the present invention is that, in a semiconductor integrated circuit which consists of a plurality of circuit blocks performing signal processing, the semiconductor integrated circuit comprises a noise detecting circuit which detects noise on power supply nets inside at least one circuit block, and performs interruption for preventing a malfunction to the above-described circuit block itself or another circuit block relating to this signal processing with this detection signal of the above-described noise detecting circuit.

Concretely, the interruption according to this embodiment is the processing of making the above-described circuit block itself or other circuit blocks, relating to this signal processing, rerun the signal processing by the above-described interruption if a detection signal which shows that noise on power supply nets which induces a malfunction arises in a semiconductor integrated circuit is outputted from the above-described noise detecting circuit. In addition, if a detection signal which shows that noise on power supply nets which induces a malfunction arises in the above-described semiconductor integrated circuit is again outputted from the above-described power supply noise detecting circuit at the time of the above-described rerun, the process shifts to system failure treatment.

According to the first embodiment of the present invention as explained above, in regard to the noise on power supply nets exceeding an error-including level rarely generated when the capacity of bypass condensers is not sufficient, it is possible to prevent a malfunction by performing noise detection and interruption. That is, even if the capacity of bypass condensers is not a sufficient level for preventing a malfunction against the worst noise, it is possible to prevent the malfunction. Furthermore, chip size becomes small by suppressing an amount of bypass condensers, a manufacturing yield improves since a number of defects per chip decreases, and hence cost reduction becomes possible.

Concretely, by highly integrating an LSI twice to scaling of ¼ and suppressing the amount of bypass condensers to 20% of the current amount, chip size can be suppressed to 17 mm square or less. On the other hand, according to conventional noise measures, the necessary amount of bypass condensers becomes 16 times the current amount to the scaling of ¼, the bypass condensers occupies 80% of a chip substrate, and hence chip size becomes up to 30 mm square.

The above-described first embodiment is effective in preventing a malfunction caused by the noise on power supply nets that increases with the acceleration and high integration. In addition, it is also effective in preventing the increase of chip size accompanying the high integration and measures against the noise.

Embodiment 2

Figure 4:
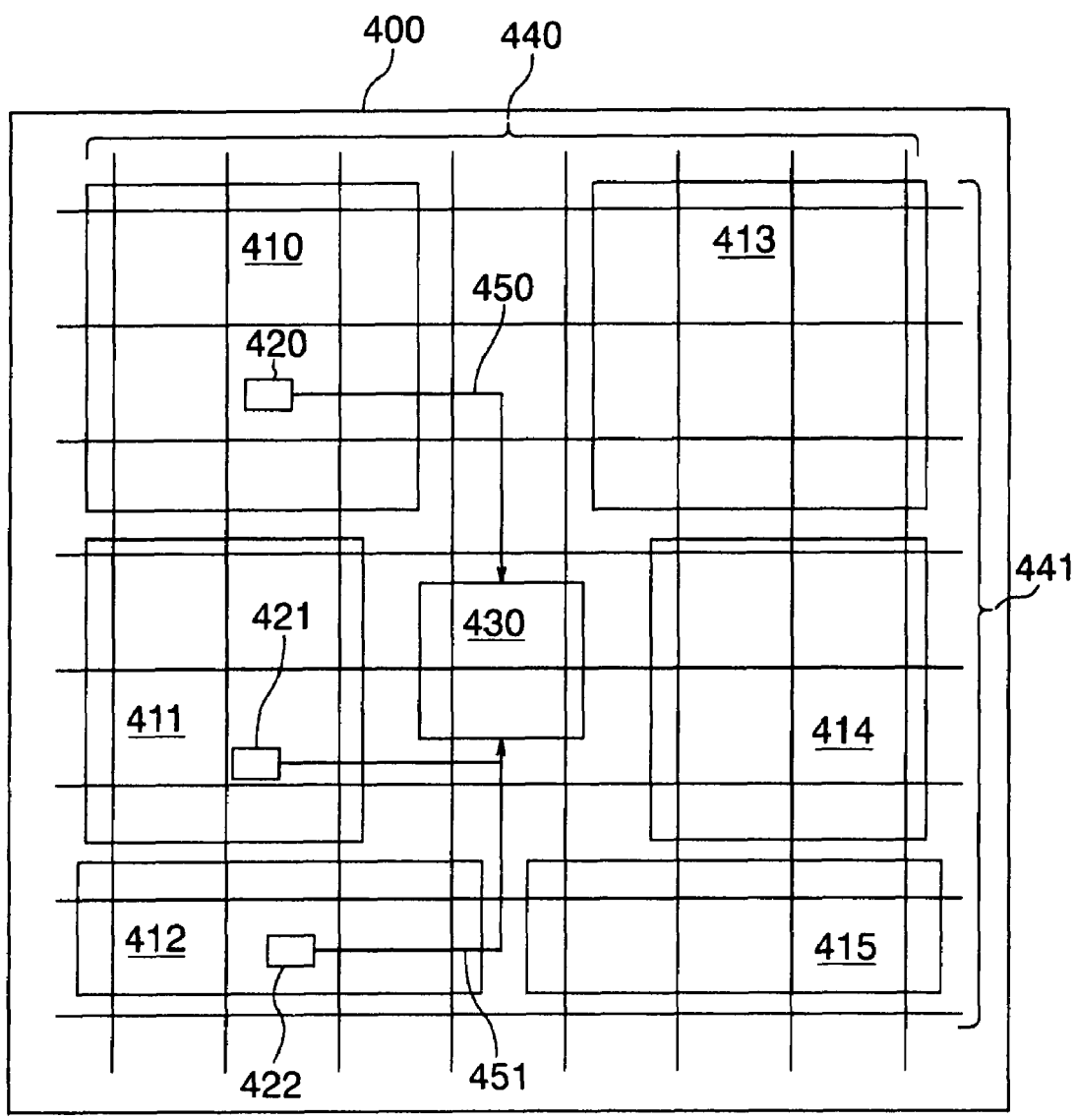
FIG. 4 is a schematic diagram of a semiconductor integrated circuit chip that has a duplex circuit block according to a second embodiment of the present invention.

FIG. 4 is a schematic diagram showing a duplex semiconductor integrated circuit that has a power supply noise detecting circuit according to a second embodiment of the present invention. In FIG. 4, a semiconductor integrated circuit 400 comprises a plurality of circuit blocks 410, 411, and 412, and redundant circuit blocks 413, 414, and 415 which have the same functions as those of the circuit blocks which correspond to each and operate in parallel. The circuit blocks 410, 411, and 412 are equipped with noise detecting circuits 420, 421, and 422 respectively. Detected outputs of the noise detecting circuits 420, 421, and 422 which detect the noise on power supply nets of respective internal power supply nets 440 and 441 are led to an interruption handling circuit 430 using lines 450 and 451. In addition, the semiconductor integrated circuit 400 has a function of reporting error generation by comparing mutual outputs of the circuit blocks that perform parallel operation with the same functions, and detecting the discrepancy.

A malfunction by the noise on power supply nets is checked by mounting each of the noise detecting circuits 420,421,422 in at least one of the pair of circuit blocks. In short, since circuits similarly operate in the pair of circuit blocks, conditions of generating noise on power supply nets also becomes the same. Hence, a malfunction can be checked by monitoring one of the pair of circuit blocks.

Figure 5:
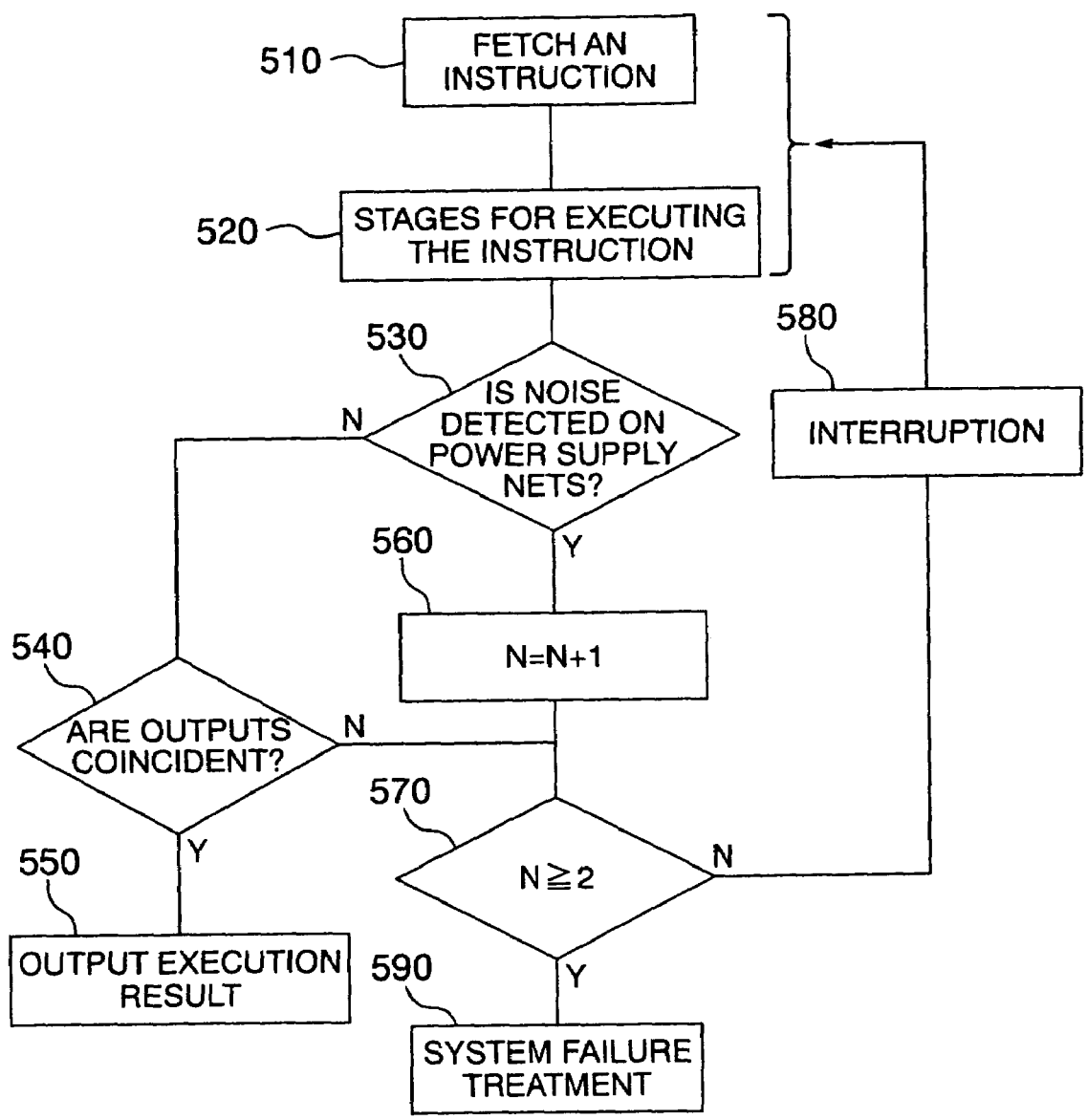
FIG. 5 is a flow chart showing an interruption of the second embodiment of the present invention.

FIG. 5 is a flow chart showing the flow of the interruption of this embodiment. The interruption flow by noise detection is the same as that in FIG. 3. However, if noise is not detected in noise detection step 530 among a plurality of stages from the fetch of an instruction (510) to the execution of the instruction (step 520), which results in NO at step 530, outputs of the duplex circuit block are compared at step 540. In the result of the comparison, if the outputs of the duplex circuit block coincide with each other, the result is outputted (step 550), and if not, the process shifts to interruption (step 580) unless the decision is made at 570 ($N \geq 2$, after N is incremented at 560), that the noise has been detected again, in which case system failure treatment 590 results. A rerun in this case is performed by returning to the fetch of the instruction (step 510) when interrupted.

Also according to this embodiment, it is possible to obtain the same effect as that in the above-described first embodiment. Then, since it is not necessary to arrange a noise detecting circuit etc. in another side of the duplex circuit block, it is possible to reduce circuit areas.

Embodiment 3

Figure 6:
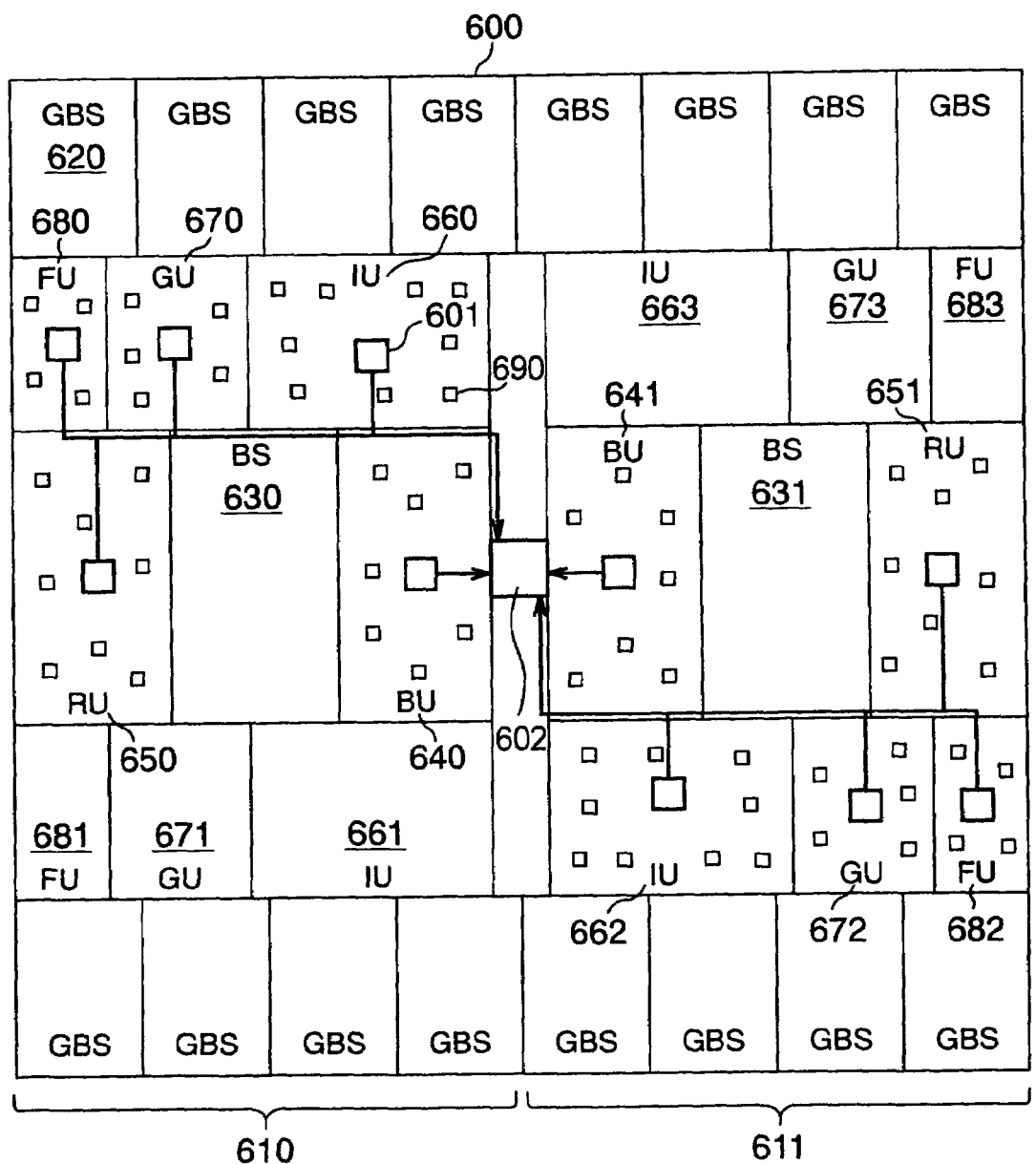
FIG. 6 is a schematic diagram of a semiconductor integrated circuit chip which has a duplex circuit block according to a third embodiment of the present invention.

FIG. 6 is a schematic diagram showing a duplex processor that has a noise detecting circuit according to a third embodiment of the present invention. In FIG. 6, a processor chip 600 has two processors 610 and 611. The processor 610 comprises a buffer storage BS630, a buffer control unit BU640, a recovery unit RU650, duplex instruction units IU660 and 661, duplex general arithmetic units GU670 and 671, and duplex floating point execution units FU680 and 681. The processor 611 has the same configuration as that of the processor 610, and comprises a buffer storage BS631, a buffer control unit BU641, a recovery unit RU651, duplex instruction units IU662 and 663, duplex arithmetic units GU672 and 673, and duplex floating point execution units FU682 and 683. The global storage unit GSB620 is used in common in the two processors 610 and 611. In addition, a noise detecting circuit 690, which detects noise on power supply nets every circuit block, and an interruption handling circuit 601 that constitutes a unit are provided inside each unit. However, in the duplex units, any one of them has the noise detecting circuit 690 and interruption handling circuit 601. The interruption to a unit that does not have an interruption handling circuit 601 is performed via a control signal-adjusting block 602. In addition, although not shown, mesh-shaped internal power supply nets are arranged in the chip 600, and the noise detecting circuit 690 is connected with the same power supply nets as those of general logical circuits.

Figure 7:
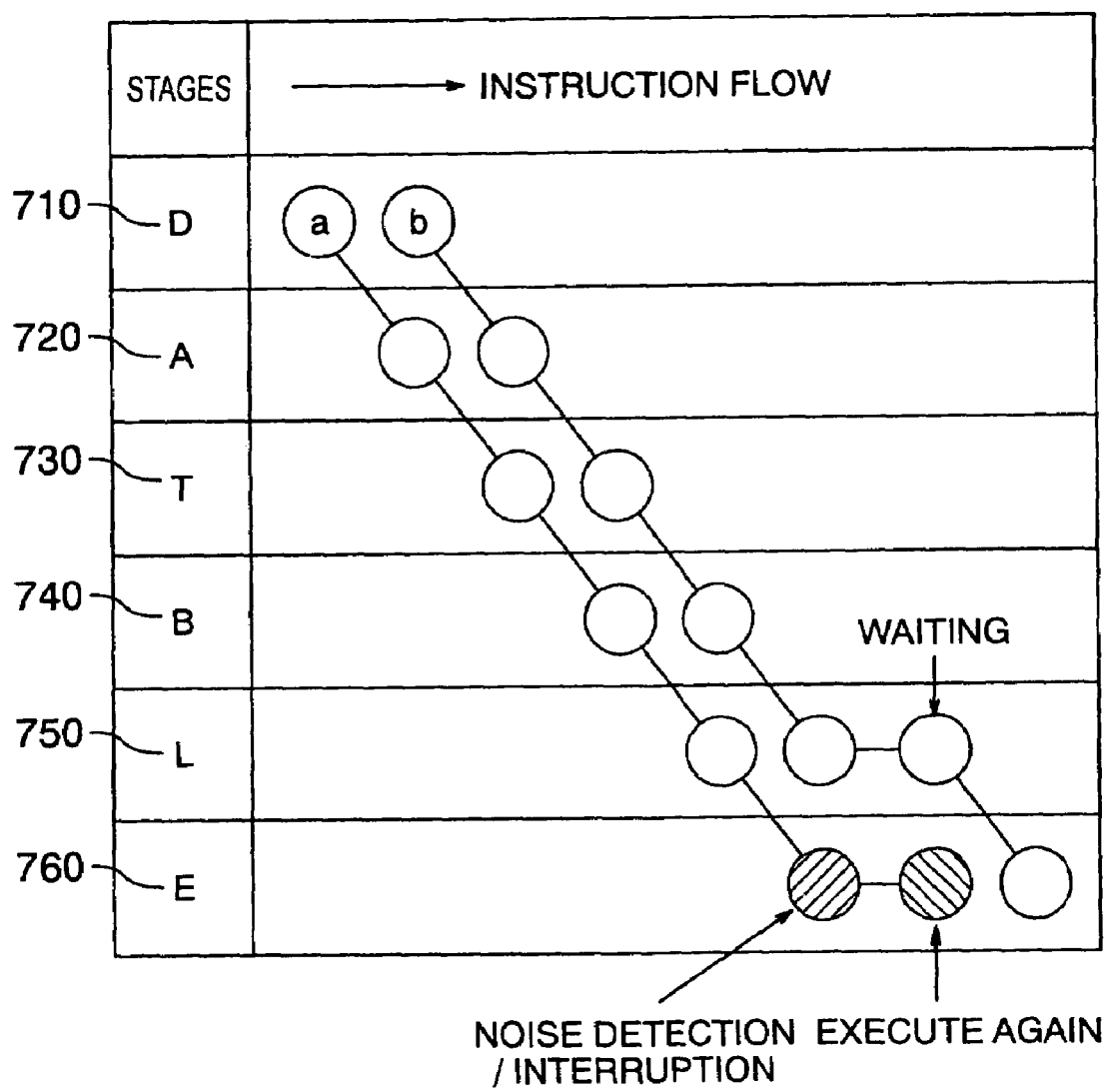
FIG. 7 is an explanatory diagram showing a pipeline of instruction processing in a third embodiment of the present invention.

Also in this embodiment, interruption flow is the same as that in FIG. 3 or 5. FIG. 7 shows the pipeline of instruction processing in this embodiment. An instruction is executed at seven stages, that is, a stage D where the instruction is fetched and decode preparation is performed (710), a stage A where decode and address computation are performed (720), a stage T where referring translation lookaside buffer (TLB) is performed (730), a stage B where referring buffer address array (BAA) is performed (740), a stage L where loading operands on an execution unit is performed (750), and a stage E where a result is obtained by operating an arithmetic unit (760). The operation of each stage is advanced in a pipeline mode.

An instruction begins from a and goes to b sequentially. Here, for example, if noise is detected to the instruction a; and on the stage E (760), the process shifts to interruption within the cycle where the noise is detected, and a rerun is performed in the following cycle. The rerun is performed on the stage (760) where the noise is detected. However, if the rerun is too late for the following cycle, the rerun is performed in the cycle after the next cycle. In addition, the following instruction b waits on stage L (750) while performing the rerun of the instruction a, since the process cannot move from the stage L to the stage E.

Figure 8:
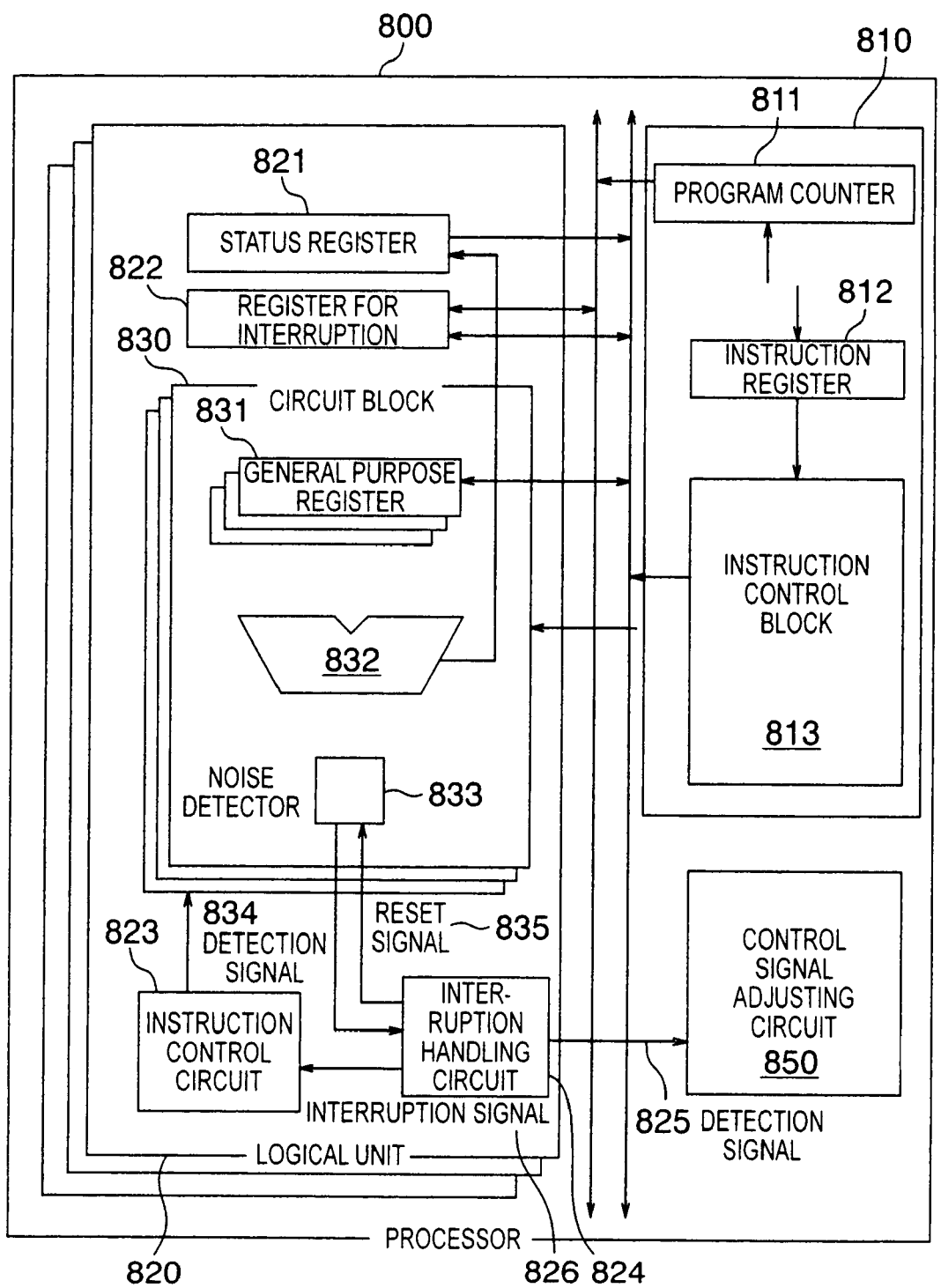
FIG. 8 is a block diagram showing an instruction operation of the third embodiment of the present invention.

FIG. 8 is a block diagram of instruction operation of the above-described third embodiment of the present invention. In FIG. 8, a processor 800 consists of an instruction controller 810 and a plurality of logical units 820. The instruction controller 810 decodes an instruction that an instruction register 812 fetches, and generates a signal required for an instruction sequentially. The logical unit 820 comprises, for example, an execution circuit block 830, a status register 821 which stores a state of precalculation, a register 822 for interruption, which saves information required at the time of the recovery from interruption, an instruction control circuit 823, and an interruption handling circuit 824. The execution circuit block 830 comprises a plurality of general purpose registers 831 that store the data transmitted, an execution unit 832, and a noise detecting circuit 833.

Here, operation under interruption will be described with citing a case, where noise is detected on the stage E (760) as an example, similarly to the case of the pipeline shown in FIG. 7. A signal required for an instruction is generated by the instruction control block 813 decoding an instruction that the instruction register 812 fetches, and the instruction is executed in the execution circuit block 830 with the signal. If the noise detecting circuit 833 detects noise during arithmetic operation in the execution circuit block 830, the signal 834 is sent to the interruption handling circuit 824. The interruption handling circuit 824 sends the signal 825 to an on-chip control signal-adjusting block 850 so as to make it possible to perform duplex comparison after the interruption, while sending an interruption signal 826 to the instruction control circuit 823 in the logical unit. The instruction control circuit 823 makes the execution circuit block 830 stop the arithmetic operation, and stores information, required at the time of the recovery from the interruption, in the register 822 for interruption. The required information is values of the general purpose registers 831, status register 821, and program counter 811.

A rerun is performed in the following cycle. Saving of the required information and preparation of the rerun are performed in an interval from interruption to the start of the following cycle. Since being performed on the stage E 760 where the noise is detected as shown in FIG. 7, the rerun is performed by restoring the values of the general purpose registers 831.

Figure 9:
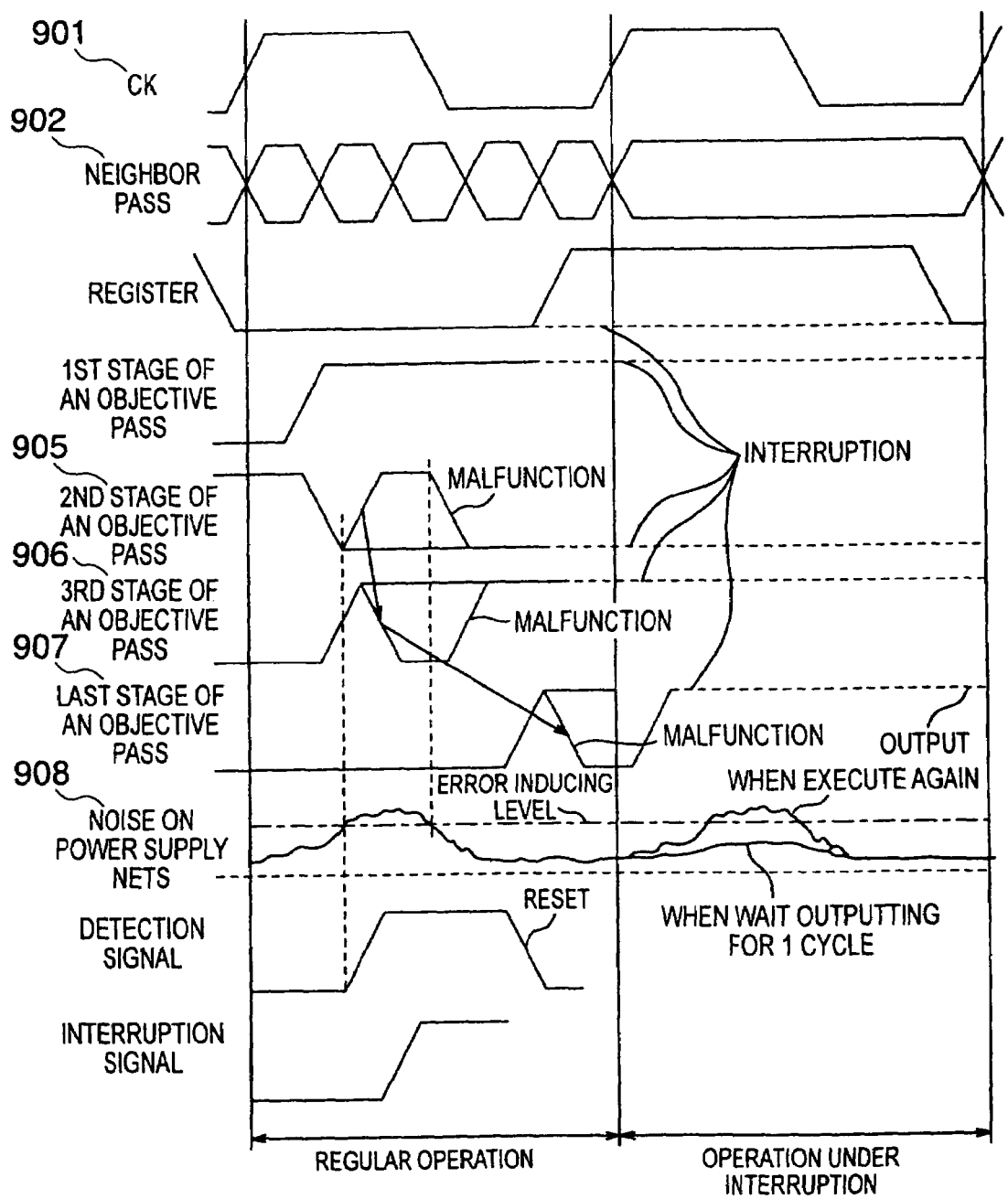
FIG. 9 is a timing chart of an interruption of the third embodiment of the present invention.

The above-described interruption is performed by an interruption program operating. FIG. 9 is a timing chart showing the timing of the interruption according to the third embodiment of the present invention. In FIG. 9, regular operation and interruption will be described in order.

Regular Operation

Data inputted into the plurality of general-purpose execution units are propagated one by one to the gate of each path simultaneously at the rise time of a clock (CK) 901 inside a circuit block. Hence, in the vicinity 902 of the path concerned, since many gates change simultaneously, noise on power supply nets becomes large by the switching current. For example, if large noise 908 which exceeds an error-including level of a gate in the vicinity of a second stage 905 of the path concerned occurs, in regard to the operation of the path concerned, a malfunction arises only while the noise is over the error-including level on the second stage as shown in the figure. The malfunction propagates from a third stage 906 to the final stage 907. At the final stage 907, regular operation is not yet recovered to a latch point of the following cycle, and hence a malfunction output is latched.

Operation Under Interruption

The interruption here described is not a rerun (arithmetic operation after saving and clearing the content of registers and inputting the same contents again), but is such interruption that the contents of the registers are made to be inputs to the following cycle as it is and output results are carried over to the following cycle. When the contents of registers are made to be inputs to the following cycle as it is, the gates are hardly switched, and hence the noise on power supply nets, 908 caused by the switching current also becomes small. That is, the noise 908 that exceeds the error-including level of the gates is not generated. Therefore, a malfunction does not arise in the following cycle, but conversely, the malfunction on the final stage 907 is corrected to regular operation, and a correct output result is latched at a latch point of a cycle after the following cycle. In short, by extending a latch point by one cycle, it becomes possible to output the contents that become normal values returned from the malfunction.

According to the above-described third embodiment mentioned, in the processor which consists of a plurality of logical circuit blocks or memory circuit blocks, it is possible to prevent a malfunction by performing interruption per unit even in a processor having a plurality of units therein since the processor has a power supply noise detecting circuit inside at least one circuit block and has a circuit block performing recovery processing for the above-described logical circuit blocks or memory circuit blocks through receiving a detection signal of the above-described power supply noise detecting circuit.

In addition, in a semiconductor integrated circuit, the gates hardly operate by suspending an output of the signal processing result of the above-described circuit block in the clock cycle concerned with the above-described interruption and outputting the signal processing result in the following or later cycle if a detection signal which shows that the noise on power supply nets which induces a malfunction arises is outputted from the above-described power supply noise detecting circuit. Therefore, the noise on power supply nets becomes noise that is less than the error-including level of the gates and the malfunction is corrected to the regular operation in the interruption cycle, and hence malfunction prevention is possible.

In addition, according to the above-described third embodiment, also in a processor chip, there is an effect for preventing a malfunction caused by noise on power supply nets that increases in relation to the acceleration and high integration. Furthermore, there is an effect for preventing the increase of chip size accompanying the high integration and measures against noise.

Embodiment 4

Figure 10:
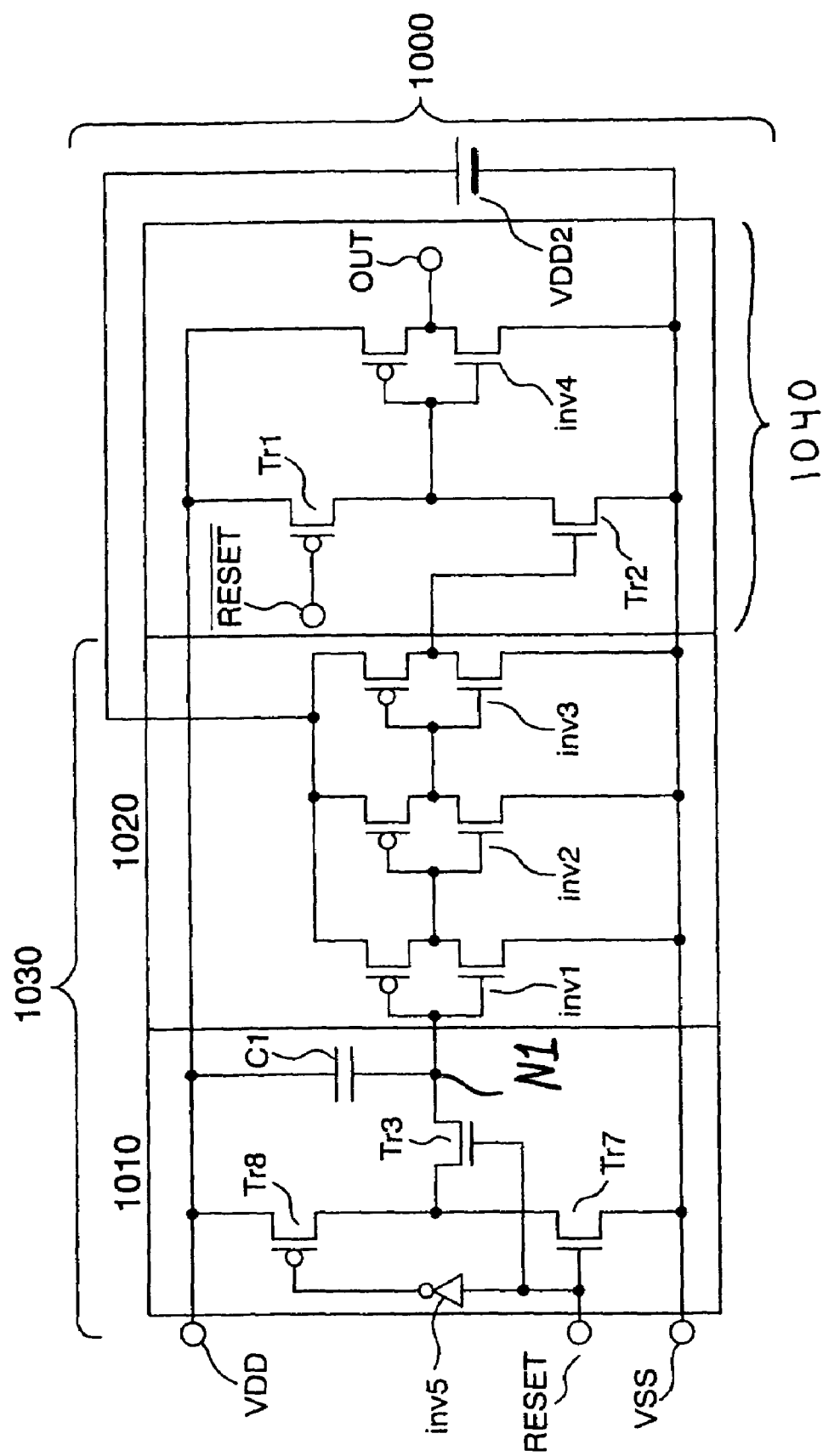
FIG. 10 is a circuit diagram showing a fourth embodiment of the present invention.

FIG. 10 shows a fourth embodiment of the present invention. According to this embodiment, the noise in both VDD and VSS can be detected in one circuit 1000. A condenser C1, transistors Tr3, Tr7, and Tr8, and an inverter inv5 constitute a level shift circuit 1010. Inverters inv1, inv2, and inv3 constitute a level discriminator 1020. The level shift circuit 1010 and level discriminator 1020 together constitute a noise detector 1030. VDD2 is a positive power supply for the level discriminator 1020. The transistors Tr1 and Tr2, and inverter inv4 constitute a detection signal holder 1040.

First, the operation of the level shift circuit 1010 will be described. When the reset signal reset is set to be HIGH, Tr3, Tr7, and Tr8 are turned on, and a junction point N1 is precharged at the voltage that is obtained by dividing the voltage (VDD–VSS) by an on-resistance ratio of the Tr7 and Tr8. Next, when the reset signal reset is set to be LOW, Tr3, Tr7, and Tr8 are turned off, but since charges are saved in C1, the voltage when precharging N1 is held. Here, suppose that noise occurs in VDD. Since VDD and N1 are combined by C1 in alternating current, the noise generated in VDD is shifted at its level, and is inputted into inv1.

Next, the operation of the level discriminator 1020 will be described. For simple description, it is assumed that VSS is a grand level (0 V), VDD2 is VDD/2, a threshold voltage of inv1 is VDD/4, and a precharge voltage of the inv1 input by the level shift circuit 1010 is VDD/3. For example, when VDD is 1.2 V, VDD2 is 0.6 V, the above-described threshold voltage is 0.3 V, and the above-described precharge voltage is 0.4 V.

Generally, since there is supply voltage dependence at the threshold voltage of an inverter circuit, the threshold voltage of the inverter changes if noise occurs in VDD. Nevertheless, in this embodiment, the positive power supply of the level discriminator 1020 is supplied from the power supply VDD2 that is different from VDD and keeps a voltage with VSS constant. Hence even if noise occurs in VDD, the threshold voltage of inv1 is fixed.

If noise larger than the difference (0.1V) between the precharge voltage (0.4V) and the threshold voltage (0.3V) of inv1 occurs, an input voltage of inv1 is less than the threshold voltage. Hence, the output of inv1 is reversed and the reversal signal is amplified by inv2 and inv3 and the gate of Tr2 is turned to be HIGH. On the contrary, if noise smaller than the difference (0.1V) between the precharge voltage (0.4V) and the threshold voltage (0.3V) of inv1 occurs, inv2 and inv3 are not reversed, and the gate of Tr1 is kept to be LOW. The noise detection sensitivity of this level discriminator can be freely set by changing the combination of the precharge voltage and the threshold voltage of inv1.

Next, the operation of the detection signal holder 1040 will be described. If the reset signal reset is HIGH and noise does not occur (that is, an output of inv3 is LOW), Tr1 is turned ON and Tr2 is turned OFF. Furthermore, an input of inv4 is precharged and becomes HIGH, and hence an output signal OUT becomes LOW. If the reset signal reset is LOW, Tr1 is turned off, but the input of inv4 is HIGH by the precharged charges, and the output OUT is held at LOW. Then, the level discriminator 1020 operates to turn on Tr2 when the output of inv3 becomes HIGH, and hence the precharged charges are discharged. In consequence, the input of inv4 becomes LOW and OUT becomes HIGH. Once noise is detected, the output OUT can be held at HIGH, and hence this embodiment can also detect glitch-like noise. If the reset is again set to be HIGH, the output OUT can be restored to LOW.

As described above, the detection signal holder 1040 is a dynamic circuit that becomes a precharge phase in the period of HIGH and becomes an evaluation phase in the period of LOW.

Figure 11A:
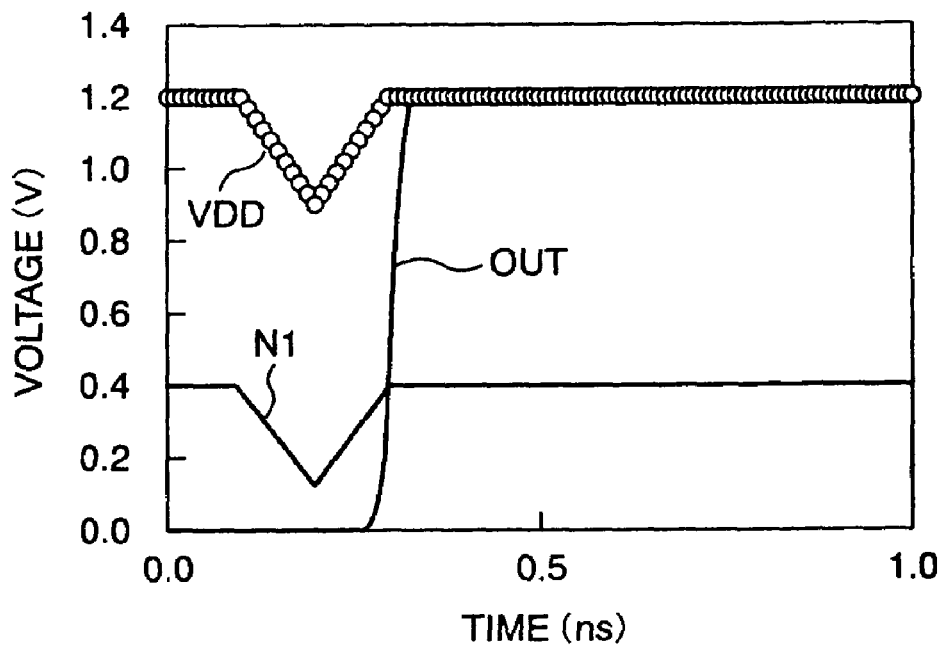
FIGS. 11A and 11B are operational wave form charts of the fourth embodiment of the present invention.

FIG. 11A shows operating waveforms in this embodiment at the time when noise occurs in VDD. The noise of −0.3 V occurs in VDD (VDD drops from 1.2 V to 0.9 V). The DC level of the noise waveform drops to 0.4 V (N1) by the level shift circuit, and the minimum value (about 0.1 V) of the noise waveform becomes lower than the threshold voltage (0.3 V) of inv1. Hence the noise detection output OUT becomes HIGH.

Figure 11B:
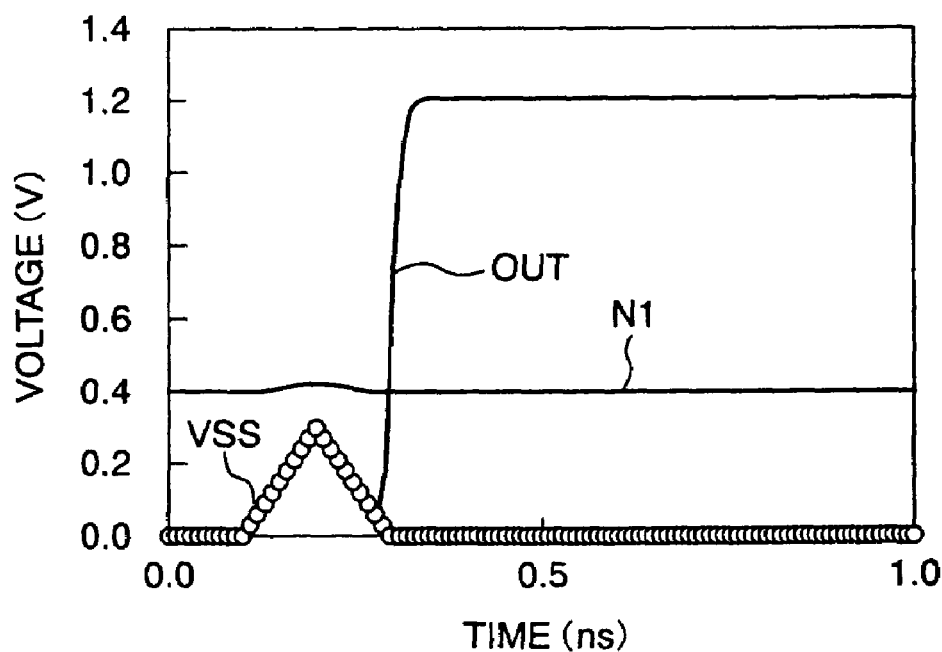

FIG. 11B shows operating waveforms in this embodiment at the time when noise occurs in VSS. The noise of +0.3 V occurs on VSS (VSS increases from 0.0 V to 0.3 V). Since following VDD, the voltage of N1 does not change and is nearly constant (0.4 V) even if VSS changes. On the other hand, since VDD2 and the threshold voltage of inv1 are changed with following VSS, the threshold voltage of inv1 goes up from 0.3 V to 0.6 V. Since the input voltage of inv1 is relatively less than the threshold voltage, the noise detection output OUT becomes HIGH.

As described above, this embodiment can detect the noise on VSS as well as VDD.

Embodiment 5

Figure 12:
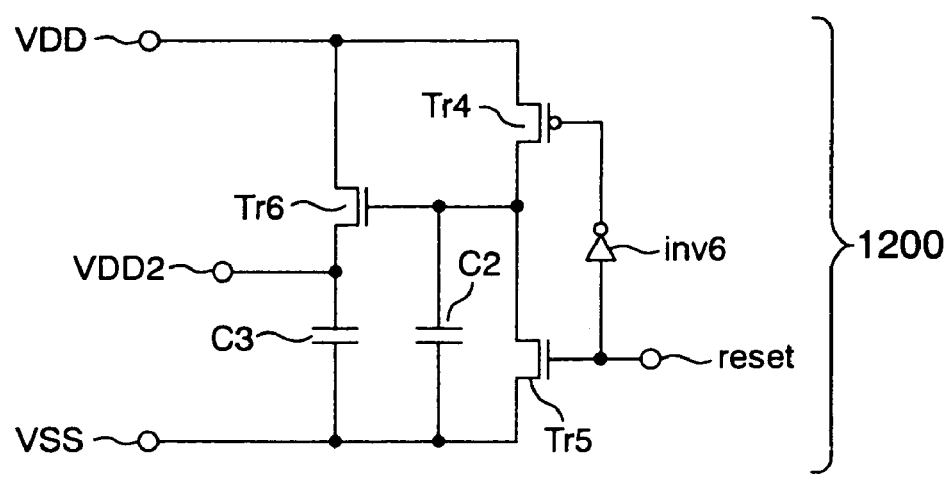
FIG. 12 is a circuit diagram showing a fifth embodiment of the present invention.

FIG. 12 shows a fifth embodiment of the present invention. A circuit in FIG. 12 is a voltage generator for the above-described level discriminator. According to this embodiment, the voltage VDD2 that changes with following the voltage fluctuation of VSS can be generated.

The operation of this voltage generator 1200 will be described. If the reset signal reset is set to be HIGH, the voltage generator 1200 becomes in a voltage-setting mode of output VDD2, and if the reset signal reset is set to LOW, the voltage generator 1200 becomes in a power supply mode to the above-described level discriminator.

First, the reset signal reset is set to be HIGH. At this time, it is assumed that the noise on power supply nets on VDD and VSS is sufficiently small. The reset signal reset is inputted into a transistor Tr4 through the transistor Tr5 and inverter inv6, and Tr4 and Tr5 are turned on. In consequence, the voltage (VDD–VSS) is divided with the on-resistance ratio of Tr4 and Tr5. The condenser C2 is charged with the above-described voltage divided. It is assumed that the capacity value of C2 is sufficiently larger than the gate capacitance of the transistor Tr6. Tr6 constitutes a source follower. Since an input to a first stage of inverter of the above-described level discriminator is precharged to about a threshold value, a steady state current flows slightly. The steady state current is supplied from this source follower. C3 is a bypass condenser that functions in order to stabilize VDD2.

The reset signal reset is set to be LOW at the time of noise detection. Since Tr4 and Tr5 become off and charges charged in the gate of Tr6 and C2 are not discharged, a voltage between the gate of Tr6 and VSS is kept constant. Since Tr6 is a source follower and just slight steady state current flows, VDD2 becomes a voltage lower than the gate voltage of Tr6 by the threshold voltage of Tr6. If the threshold voltage of Tr6 is set to be sufficiently small, VDD2 fluctuates with following VSS when VSS fluctuates.

On the other hand, when VDD fluctuates, the voltage between VDD and drain of Tr6 fluctuates and the voltage of a source to VSS hardly fluctuates because of the principle of a source follower circuit, and hence the voltage of VDD2 to VSS is fixed.

Figure 13:
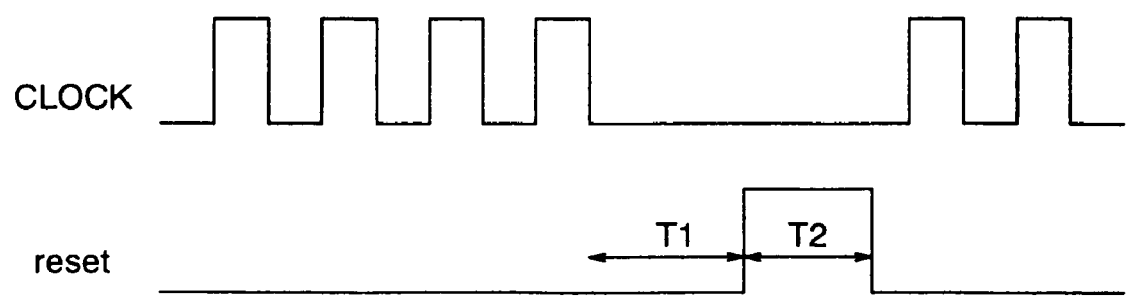
FIG. 13 is an operational timing chart of the fifth embodiment of the present invention.

Next, the timing when the reset signal reset is inputted will be described. FIG. 13 is a timing chart showing the timing of the reset signal reset and a clock signal. In a semiconductor integrated circuit that operates with synchronizing with a clock signal, noise is generated with synchronizing with clock edges. In this embodiment, a clock is stopped before a time interval T1 at the time of reset for the operation of the integrated circuit to be interrupted. T1 is the time interval required for the noise on power supply nets converging. A time interval T2 is an interval required for charging the gate of Tr6 and C2 after setting the reset signal reset to be HIGH. After a lapse time of T2 since setting the reset signal reset to be HIGH, the reset signal reset is set to be LOW, and the clock is resumed after that. The precharge of the first stage of the above-mentioned level discriminator is also performed on this timing. In short, since the periods of the operation of the semiconductor integrated circuit which is a noise source and the reset operation are separated, the voltage VDD2 and the precharge voltage of the first stage of the noise detector are not influenced by noise. Hence it is possible to set constant values for the voltage VDD2 and precharge voltage. Moreover, there is a possibility of the gate voltage of Tr6 and the precharge voltage of the first stage of the level discriminator may be lowered due to leakage current over the long term. Then, VDD2 voltage is periodically reset like refresh operation in DRAM.

As described above, according to this embodiment, a VDD2 generating power supply that changes with following the voltage fluctuation of VSS and keeps (VDD2–VSS) constant can be realized. If this embodiment is combined with the fourth embodiment, it is possible to realize a noise detecting circuit that operates with a single power supply and does not require a dedicated power supply from the outside.

Embodiment 6

Figure 14:
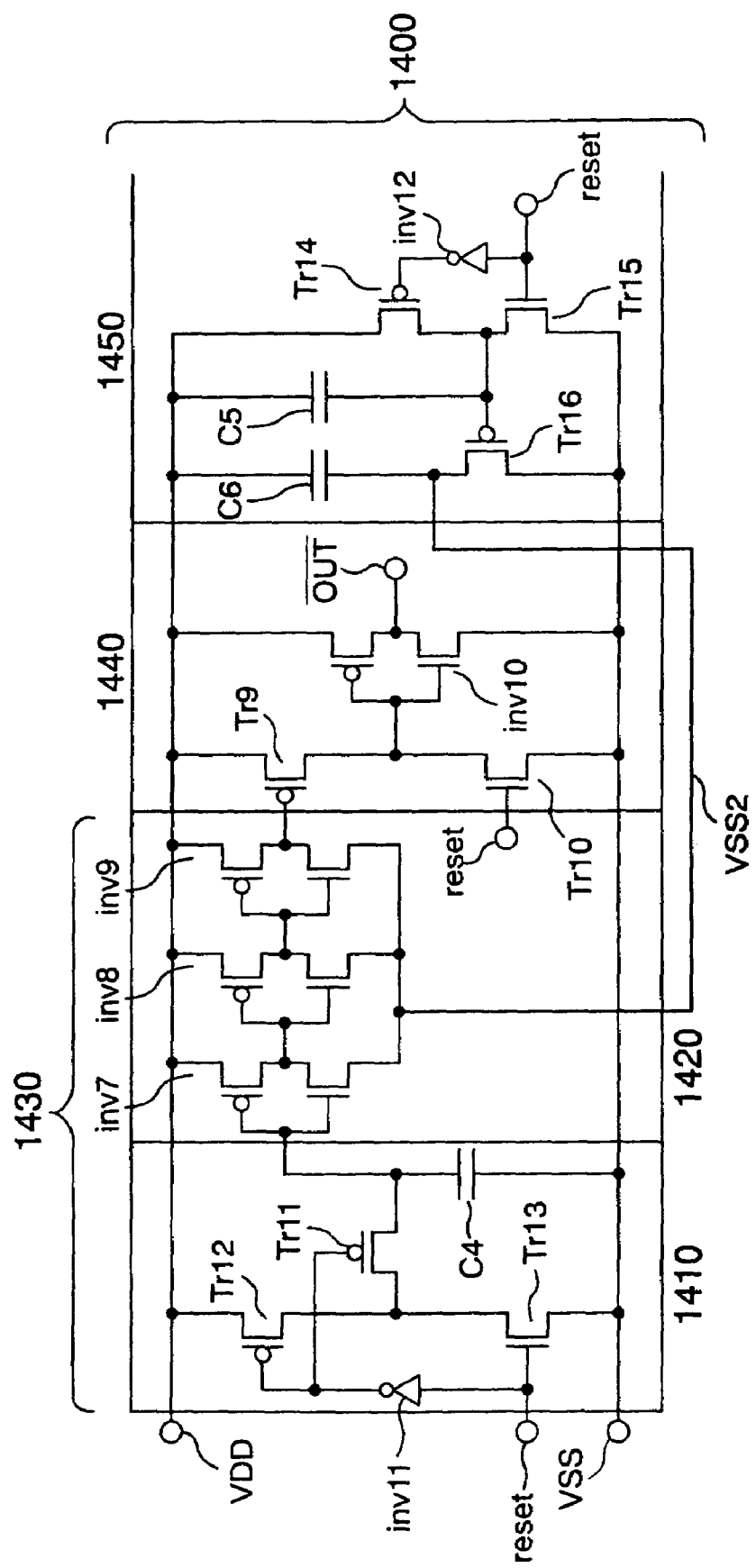
FIG. 14 is a circuit diagram showing a sixth embodiment of the present invention.
Figure 15:
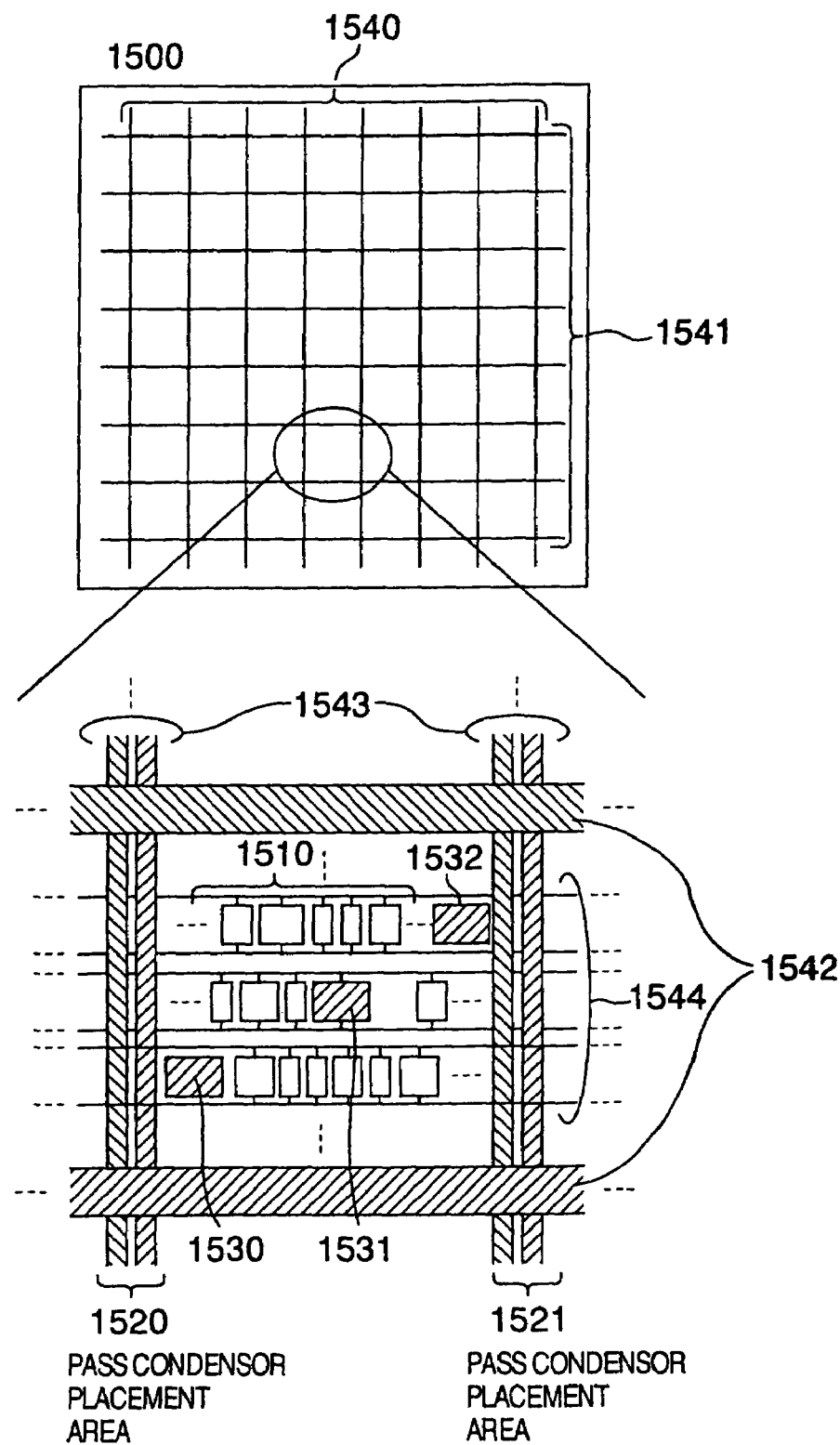
FIG. 15 is a schematic diagram showing a semiconductor integrated circuit on which conventional bypass condensers are mounted.

A sixth embodiment of the present invention is shown by the circuit 1400 in FIG. 14. This embodiment is characterized in that noise on VSS is inputted into the first stage inv7 of the level discriminator after level shifting, and that the voltage VSS2 that follows the fluctuation of VDD is generated.

A condenser C4, transistors Tr11, Tr12, and Tr13, and an inverter inv11 constitute a level shift circuit 1410. Inverters inv7, inv8, and inv9 constitute a level discriminator 1420. The level shift circuit 1410 and level discriminator 1420 together constitute a noise detector 1430. VSS2 is a negative power supply for the level discriminator 1420. Transistors Tr9, Tr10, and an inverter inv10 constitute a detection signal holder 1440. Transistors Tr14, Tr15, and Tr16, an inverter inv12, and condensers C5 and C6 constitute a voltage generator 1450.

The above-described voltage generator 1450 generates VSS2 so that (VDD–VSS2) may become fixed. If the reset signal reset is set to be HIGH, the voltage setup of VSS2, precharge voltage setup of inv7, and reset of the noise detection result OUT are performed. If the reset signal reset is set to be LOW, the semiconductor integrated circuit becomes in a noise detectable state.

For example, by setting VSS2, the above-described threshold holding voltage, and above-described precharge voltage to be 0.6 V, 0.9 V, and 0.8 V respectively when VDD is 1.2 V, noise on VDD and VSS is detectable like the above-described fourth embodiment. Although the above-described fourth embodiment has circuit configuration on the basis of VSS, since it is possible to consider VDD as a reference according to this embodiment, there is an effect that the degree of freedom of circuit design increases. According to the present invention, there are the following effects:

There is an effect of preventing a malfunction caused by noise on power supply nets increasing in relation to the acceleration and high integration by performing interruption with a detection signal of the above-described power supply noise circuit. In addition, there is another effect of preventing the increase of the chip size accompanying the high integration and the measures against noise, and the cost increase accompanying yield decrease.

There is still another effect of suppressing the increase of the circuit size caused by the noise detecting circuit by arranging the power supply noise detecting circuit inside at least one circuit block of the above-described duplex circuit block.

There is the same effect as that in item (1) also in the processor that consists of the above-described plurality of logical circuit blocks or memory circuit blocks.

There is a further effect of making it possible to detect the noise in VDD and VSS by constituting the above-described noise detecting circuit of a level shift circuit and a level discriminator.

There is a still further effect of detecting noise under a noise environment by generating a voltage that fluctuates with following the voltage fluctuation of the above-described power supply. In addition, there is another effect of operating with a single power supply, realizing a noise detecting circuit which does not need a dedicated power supply from the outside, and preventing the deterioration of wiring property caused by the wiring restriction due to other signal lines.

What is claimed is:

1. A semiconductor integrated circuit which includes a plurality of circuit blocks each receiving data from at least one of the other circuit blocks to perform signal processing, comprising:

at least one pair of circuit blocks, which has the same functions as each other and operates data in parallel along a plurality of processing stages;

a noise detecting circuit, which detects noise on power supply nets, inside of one circuit block within said one pair of circuit blocks, and an interruption handling circuit, which issues a first interruption signal to said pair of circuit blocks to interrupt progression of a current processing stage progressed in said pair of circuit blocks when said noise detecting circuit detects noise inside of the one circuit block and to rerun the data operation of said pair of circuit blocks from the interrupted processing stage, and issues a second interruption signal to said pair of circuit block to interrupt output of processed data from said pair of circuit blocks when processed data of said pair of circuit blocks is determined to be non-coincident with each other and to rerun the plurality of processing stages in said pair of circuit blocks.

2. A semiconductor integrated circuit according to claim 1, wherein said interruption handling circuit generates a signal to cause the semiconductor integrated circuit to produce a system failure state when the noise detecting circuit detects noise inside the one circuit block again during the rerun of the interrupted processing stage.

3. A semiconductor integrated circuit that includes a plurality of circuit blocks each receiving data from at least one of the other circuit blocks to perform signal processing, one of said circuit blocks comprising:

a plurality of registers respectively storing input data for signal processing to be executed in the circuit block in each cycle of a clock, intermediate data derived in the course of said signal processing or final data indicating a result of said signal processing to be outputted from the circuit block;

an execution unit for executing arithmetic operation;

a noise detection circuit detecting noise on a power supply net, inside of the circuit block;

control means for forming data paths between said registers and said execution unit and for controlling data latch operation of said registers, to perform said signal processing; and interruption control means issues an interruption signal to said control means to carry over each of said registers to a next cycle of the clock so that said final data to be outputted from the circuit block is restored within the next cycle of the clock, when a detection signal outputted from the noise detection circuit in one cycle of the clock shows that noise on the power supply nets arises to a level which induces a signal processing malfunction.

* * * * *